(12) United States Patent
Oz et al.

(10) Patent No.: US 6,771,087 B1
(45) Date of Patent: Aug. 3, 2004

(54) SYSTEM AND METHOD FOR TESTING INTEGRATED CIRCUIT MODULES

(75) Inventors: Oved Oz, Herzlia (IL); Abraham Mizrahi, Herzlia (IL)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/162,421

(22) Filed: Jun. 4, 2002

Related U.S. Application Data

(60) Provisional application No. 60/295,605, filed on Jun. 4, 2001.

(51) Int. Cl.[7] .............................................. G01R 31/02
(52) U.S. Cl. ..................... 324/763; 324/765; 324/158.1; 714/724
(58) Field of Search ........................ 324/73.1, 763–765, 324/158.1; 714/724–725, 733–734; 702/118–120

(56) References Cited

U.S. PATENT DOCUMENTS

| | | | |
|---|---|---|---|
| 5,794,175 A | * | 8/1998 | Conner ....................... 702/119 |
| 5,870,410 A | * | 2/1999 | Norman et al. ............. 714/725 |
| 5,936,976 A | * | 8/1999 | Story et al. .................. 714/724 |
| 6,060,897 A | * | 5/2000 | Shacham et al. ........... 324/765 |
| 6,311,303 B1 | * | 10/2001 | Gates et al. ................. 714/734 |
| 6,493,840 B1 | * | 12/2002 | Shacham et al. ........... 714/724 |

* cited by examiner

Primary Examiner—Minh N. Tang

(57) ABSTRACT

Verification testing of modules packaged within an integrated circuit are conducted utilizing I/O ports of the integrated circuit for inputting or outputting incoming and outgoing signals, with three sets of externally controlled, tri-state buffers provided for each module. A first set selectively connects predetermined I/O contacts of each module interconnected to contacts of other modules, a second set selectively connects predetermined I/O contacts of each module to the I/O ports and a common test bus, and a third set applies the last logic state on each I/O contact before isolation by a buffer from the first set. Whenever a module is selected for testing, the current value that appears on each I/O contact that is connected to other modules is stored in its corresponding bus holder, so as to essentially prevent DC leakage currents.

22 Claims, 4 Drawing Sheets

SYSTEM AND METHOD FOR TESTING INTEGRATED CIRCUIT MODULES

CLAIM FOR PRIORITY

This application claims priority to U.S. Provisional Patent Application Serial No. 60/295,605 filed Jun. 4, 2001.

TECHNICAL FIELD OF THE INVENTION

The present invention is directed, in general, to testing integrated circuits and, more specifically, to isolating and testing individual modules within an integrated circuit.

BACKGROUND OF THE INVENTION

An integrated circuit (IC) typically consists of large numbers of interconnected digital and/or analog elements. (e.g., logical gates, communication circuitry, memories, etc.) for carrying out predetermined operations. Recent advances in fabrication technology have made it possible to integrate a plurality of circuitry of different functionality into a single chip. Such implementations are usually known as System-On-a-Chip (SOC). Each circuitry, usually called a module, is designed as an independent unit having its power supply, input and output lines.

In a typical SOC development, a separate team of hardware designers designs each module. A verification team specifies and develops tests and tools, for verifying the SOC. The verification tests guaranties that the IC has been manufactured correctly and performs as expected according to simulations. However, because of the relative limitations of packaging technology, only a comparatively limited number of primary input and primary output pins (I/O pins) are provided for the testing of an integrated circuit.

Usually, each module is imported from a different team, and integrated into the SOC. Part of the design of the SOC concerns integrating adequate testing features for testing the module in the SOC. It is therefore mostly desired to exploit the modules' existing testing tools, and testing environments, of each module, and integrate them into the SOC testing environment. To utilize the existing testing infrastructure of each module for the testing of the SOC, some additional hardware is integrated to enable an efficient isolation of each of the module's input/output (I/O) lines from other operating modules, and apply a verification test compatible to its environment.

When testing the chip's modules at a "stand alone" mode, the I/O lines of the module are isolated to prevent interference that may originate at other operating modules attached to the tested module. The verification is actually conducted by applying a set of test vectors (various combinations of possible Input signals) to the inputs of the module and monitoring the output signals resulting from these signals. The expected responses resulting from a set of known input patterns can be generated based on the intended function (and/or operation) of the circuitry (functional testing). A successful verification is one in; which the output patterns that are obtained corresponding to a set of known input patterns, match the expectations according to simulations or the designated functionality of the module.

However, since the access to the module's I/O lines is usually limited, and since the verification hardware should not affect the normal functionality of the chip (i.e, in its active mode), special attention is, required to design the additional testing circuitry involved in such tests. One method for obtaining verification test results is schematically illustrated in FIG. 1. In this example, the output lines of the modules 101, 102, and 103, are connected to the chip's output port 105 through a multiplexer (MUX) 104.

The MUX 104 in this case acts as an arbitrator, which is utilized to direct the output line of the tested module to the chip's output port 105. In a similar fashion, the MUXs 321, 322, and 323 are utilized to select the active input of each module. Each one of the MUXs 321, 322, and 323 is provided with a functional signal (i.e., the input signal utilized while the module is in its normal operation mode) and the test bus signals on 307. The arbitration unit 305 produces a control signal on lines 331–333, which are utilized by the MUXs to select the appropriate signal for their output.

Such methods are efficiently implemented with relatively little additional circuitry, and control signals. However, since each module's output is directed to the output port 105 through the MUX 104, this type of testing circuitry is substantially costly in terms of the lengths of the conducting lines used, and therefore also in chip area consumption. Typically the MUX is located near the IC's port resulting in the waste of long output lines drawn from each module's output towards the MUX Inputs. Other disadvantages of such methods are expressed in extra delays, which are added to the functional signal that has to pass through the MUX.

In a typical IC, each of the modules has I/O consisting of a plurality of conducting lines. It is therefore an important necessity to struggle to provide efficient testing means utilizing I/O testing lines that are as short as possible.

Another attitude for conducting verification test to ICs is known as the "Boundary-Scan Architecture" (IEEE t (Standard 1149.1), developed by the Joint Test Action Group (JTAG). The JTAG group developed a testing method based on the concept of a serial shift register positioned around the boundary of the tested device. This concept resembles the so-called "bed-of-nails" technique that was the customary testing technique of printed circuits in the mid-1970s.

FIG. 2 schematically illustrates the boundary-scan testing method developed by the JTAG group. Each of the modules 101, 102 and 103 is equipped with supplementary "boundary scan cells" (hereinafter referred to as "scan cells"), 201a–201f, 202a–202f, and 203a–203f, that are located on the boundaries of each module. Each scans cell is a multipurpose memory element capable of performing "shift-in," "shift-out," "update," and "capture" operations. In this fashion, particular tests can be applied. to the device interconnects through the scan path formed by serially connecting the scan cells in the form of a chain.

Some of the scan cells are utilized to input test signals to the module, others to capture the module's output signals. For instance, module B 102 is equipped with scan cells 202a–202c which are utilized to introduce test patterns to the module, and scan cells 202d–202f to collect the output signals resulting from those input signals.

This architecture allows the testing of each module in its functioning environment. However, it is time consuming and cumbersome, especially when there are a substantial number of modules to test. As an example, let us suppose that a test pattern should be applied to module B 102. In such a case, the test patterns should be applied via the input port 207, and travel towards module B's input scan cells 202a–202f by performing a serial shift of the scan cells, i.e., passing the signals through module A's scan cells 201a–201f. Similarly, the resulting output pattern stored in the module's output scan cells 202d–202f will reach the output port 208 by serially shifting the signals along the scan path through module C scan cells 203a–203f.

As will be appreciated by skilled artisans, the test logic that is involved in boundary-scan tests is complex. More precisely, such test logic involves full control of the modules' clock(s) (the clock is stopped during shift-in and shift-out, and single stepped in between). As a result the testing is not run in real time, and the "stand alone" tests and testing environment need to be converted.

Another testing technique is disclosed in U.S. Pat. No. 5,936,976, and schematically illustrated in FIG. 3. This method utilizes switching devices to select the output signal, and multiplexers to select the input signal of the module to be tested. In the drawing, switching devices 211, 212, and 213 are utilized to select the output signal of the tested module. Similar to what was described hereinabove, in order to select the output signal of one of the modules 101, 102, or 103, the respective switch device is activated (switched to its conducting state), and the other switches deactivated (switched to their disconnect state). The selected output signal is fed into the output register 306.

The input signals of the modules 101, 102, and 103 are fed through the MUXs 321, 322, and 323, respectively. The MUXs selects the input signal to be applied to the modules, which may be the normal input signals 301, 302, and 303 (i.e., the signals utilized during the normal operation of the system in its functional mode), or the test vector signal 307. The test signal 307 is originated from the test vector register 304, which is actually a register that holds the test patterns that are applied to the SOC input—i.e., part of the testing infrastructure. The arbitration unit 305 is utilized to select the tested module by introducing a select signal on the respective line 331, 332, or 333. The select signal causes the respective switch device to switch to its conducting state, and the MUXs 321, 322, and 323 to choose the test input signal on 307.

Although this method benefits from application of the two perspectives discussed earlier, the test signals and the resulting output signals are always passed via the registers 304 and 306, respectively. Such a method does not enable verification of modules in a "stand alone" environment since the incoming and outgoing signals are always passed via dedicated registers. Other disadvantages stem from the delay times associated with the operation of such testing methods (i.e., using registers as buffers and MUX for arbitration), which also affect normal operation of the IC in its functional mode.

It should be understood that the functionality of the additional hardware comprised into the IC to enable the verification tests is later disabled or forced into a state which enables the normal operation of the IC in its functional mode. In the case of MUXs, for instance, when the IC operates in its functional mode, the arbitration unit 305 is configured to select the functional mode signals. In this case, the additional hardware affects the time performance of the IC when in its functional mode (due to the additional gate delay).

All the methods described above have not yet provided satisfactory solutions to the problems involved in an efficient verification test wherein the tested modules are required to be isolated from other modules in the integrated circuit.

There is, therefore, a need in the art for a method and apparatus for efficiently isolating modules in an integrated, circuit for test and verification. It would particularly be desirable for the method and apparatus to provide verification testing of integrated circuit modules with a minimal effect on the timing behavior of the circuitry in the functional mode, with a relatively small number of test signal interconnects, and with reduced or minimal the area required by long conducting lines.

SUMMARY OF THE INVENTION

To address the above-discussed deficiencies of the prior art, it is a primary object of the present invention to provide, for use in integrated circuits having one or more modules, a method for carrying out verification tests of the modules using I/O ports of the IC for inputting or outputting incoming and outgoing signals. A first set of externally controlled buffers, such as tri-state buffers, are provided for connecting or isolating predetermined I/O contacts of each module that are interconnected to contacts of other modules, and a second set of externally controlled buffers are provided for connecting or isolating predetermined I/O contacts of each module that are connected to the I/O ports and a common bus, connected to the I/O ports, for inputting test signals into, and for receiving output signals from, each module, through externally controlled buffers that belong to the second set, through the predetermined I/O contacts of each module, and through the I/O ports, and a third set of externally controlled bus holders, each of which is connected to the output of a corresponding buffer from the first set, are provided for applying the last logic state that appeared on each I/O contact before isolating the I/O contact by a buffer from the first set, are provided. Whenever a module is selected for testing, the current value that appears on each I/O contact that is connected to other modules is stored in its corresponding bus holder, so as to essentially prevent DC leakage currents. The I/O contacts connected to other modules are isolated by switching the corresponding buffers to their isolating state and immediately after, the corresponding stored current value is applied to each I/O contact that is connected to other modules, in order to essentially prevent DC leakage currents from flowing. A test signal is applied to the selected module, after connecting the input I/O contacts, and the output I/O contacts, of the selected module, that are connected to the common bus are isolated by controlling the corresponding externally controlled buffers from the second set. A signal that is output from the selected module is read after connecting the output I/O contacts, and the output I/O contacts, of the selected module, that are connected to the common bus are connected by controlling the corresponding externally controlled buffers from the second set.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, weather such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
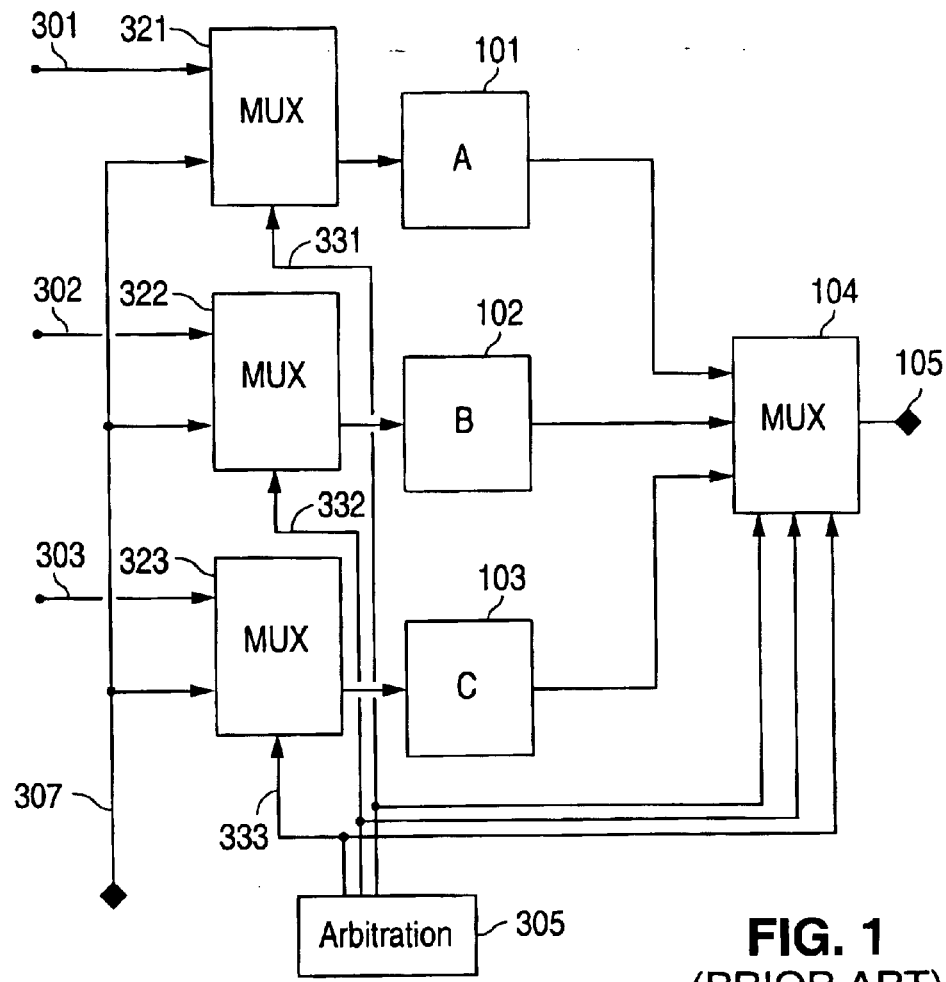
FIG. 1 schematically illustrates one method for obtaining verification test results on integrated circuit modules, by employing multiplexers within the integrated circuit.
Figure 5:
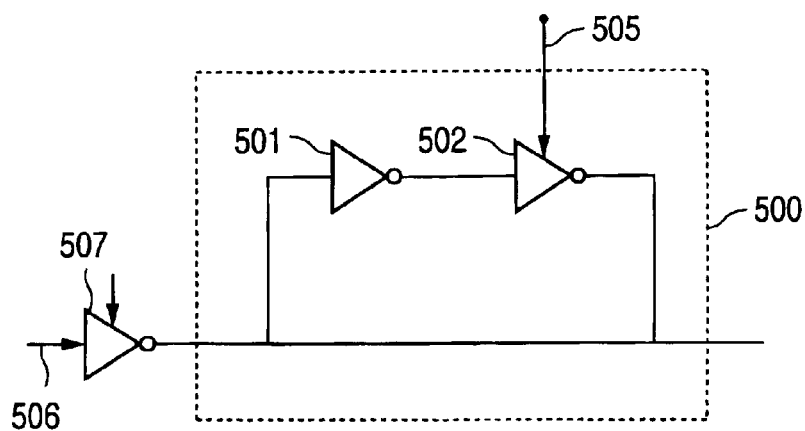
FIG. 5 schematically illustrates a bus holder structure according to one embodiment of the invention.
Figure 2:
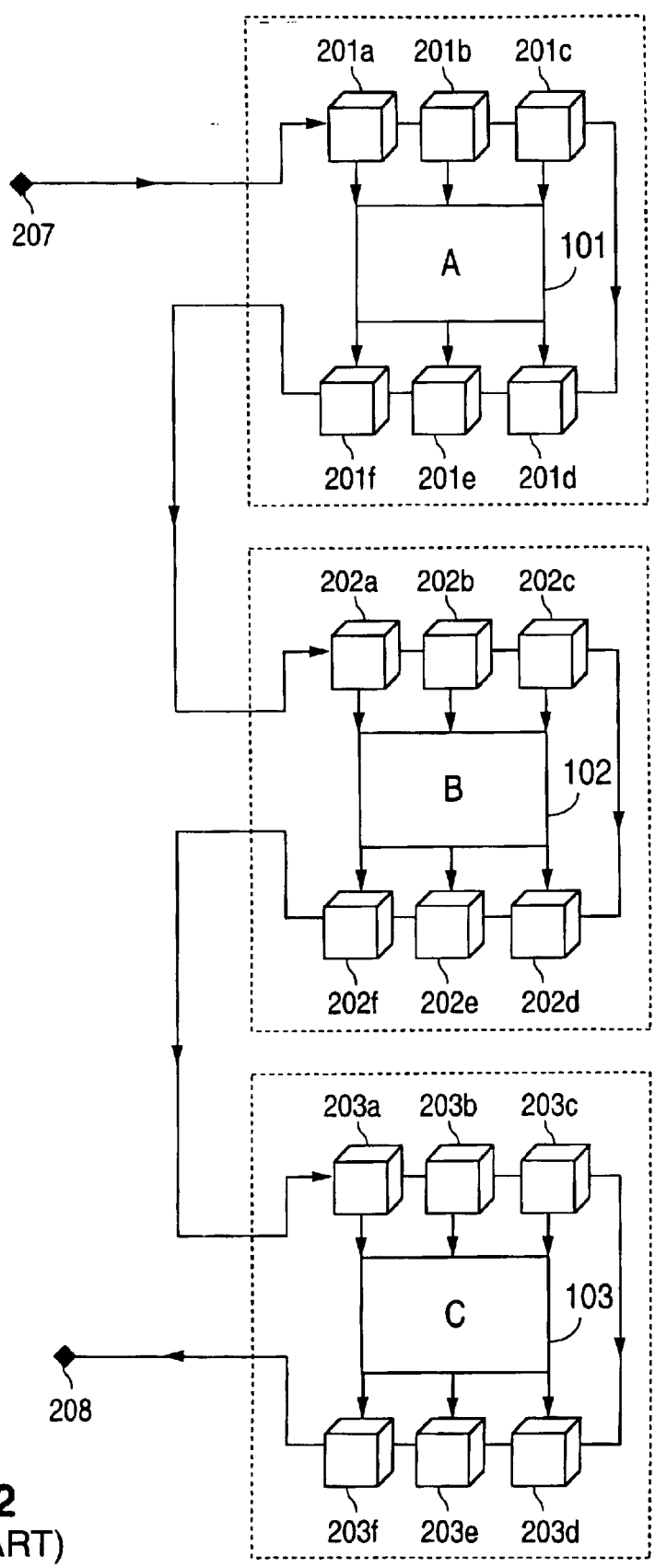
FIG. 2 schematically illustrates the boundary-scan testing method developed by the JTAG group.
Figure 3:
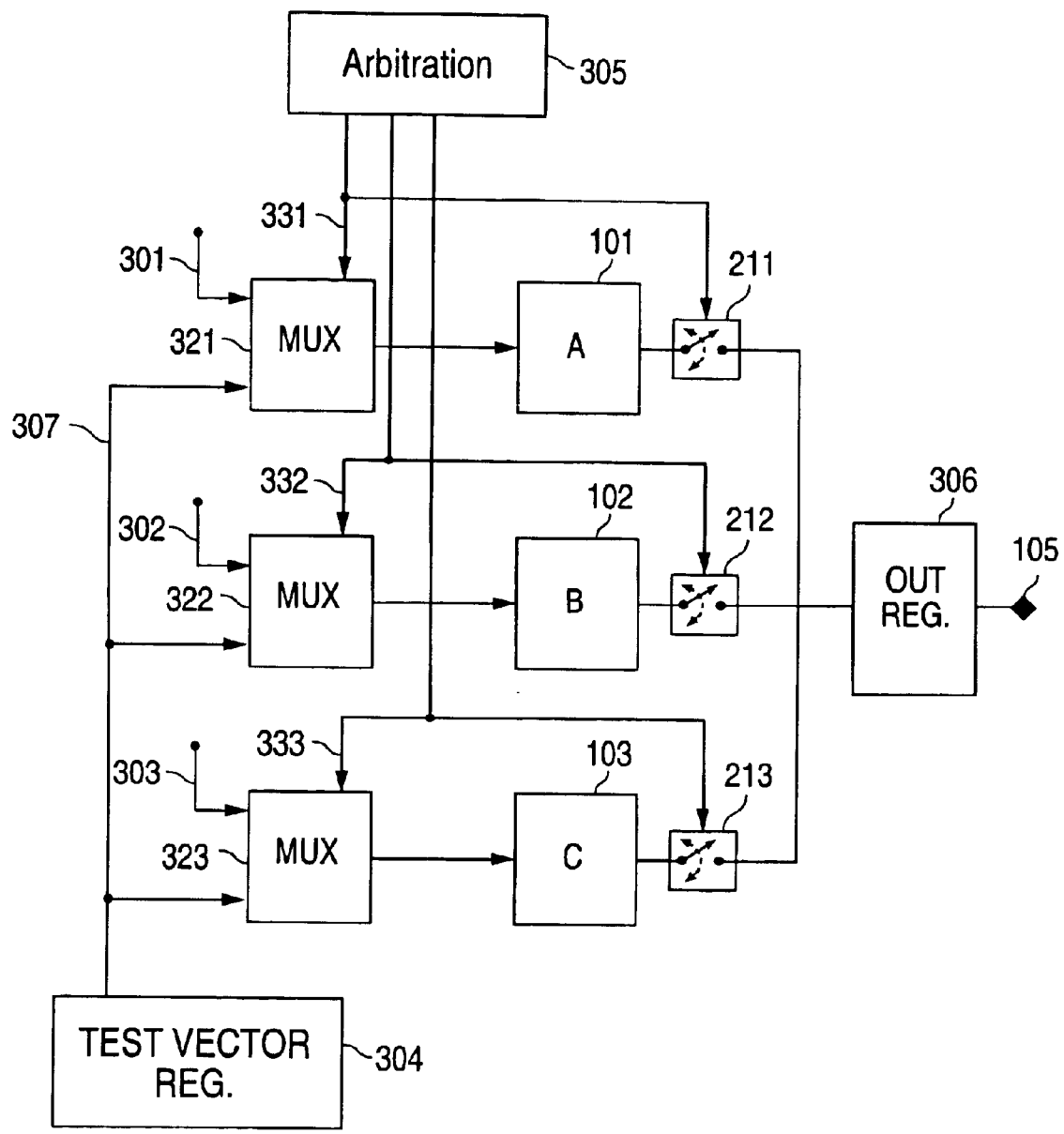
FIG. 3 schematically illustrates a method for conducting verification tests on modules of integrated circuits, which combines multiplexers and switching devices.
Figure 4:
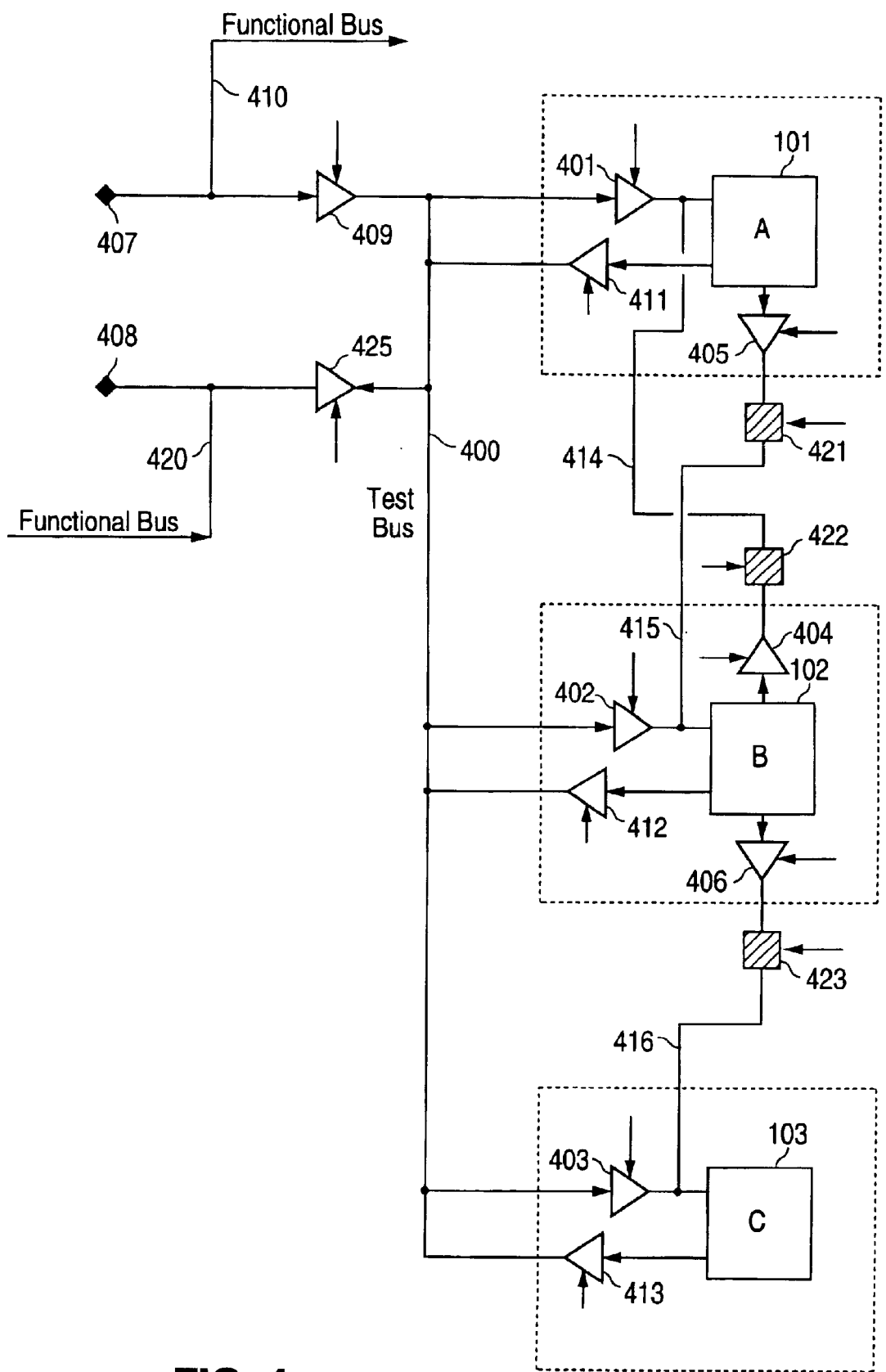
FIG. 4 schematically illustrates a verification test design for testing integrated circuit modules according to one embodiment of the present invention.

FIGS. 4 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

The verification tests of integrated circuits (ICs) comprising a plurality of modules are designed to enable isolating one module from the rest of the modules in order to apply test signal patterns to the isolated module's inputs, and to observe the resulting output patterns. Typically additional hardware is required for that purpose. The additional hardware is designed to enable the testing of individual integrated modules and to enable normal functionality of the IC, in its functional mode, with minimum side effects (e.g., time delay, extra loads, etc.)

The common methods of conducting verification tests combines the operation of MUXs and boundary scan cells to feed and monitor input and output patterns of each module in the test mode. However, this additional hardware affects the IC's performance in its functional mode. Moreover, the conducting lines utilized to route the test patterns and the resulting output signals result in the waste of expensive silicon space on the chip.

The method of the invention disclosed herein involves utilizing a dedicated bus line for verification tests during the test mode. The bus is provided to introduce the input test patterns, and to capture and route the resulting output signals. In addition, the testing infrastructure, designed independently for the individual modules, is utilized for the design of chip level verification test, thereby substantially reducing the porting effort.

FIG. 4 schematically illustrates a verification test design for testing integrated circuit modules according to one embodiment of the present invention. According to the method of the invention, a dedicated bus line 400 is utilized to carry the testing patterns and to deliver their outcomes, the test results. The bus line 400 is connected to the modules, inputs 101, 102, and 103 through the tri-state buffers 401, 402, and 403. Similarly, the modules' output signals are transferred via the bus line 400 through another set of tri-state buffers 411, 412, and 413.

The bus lines are configured differently for the testing of each module to meet the special needs required in its functional environment. More particularly, when conducting verification tests on a module, the bus is configured appropriately to allocate a set of bus lines for the input of test patterns, and another set of the bus lines for the output of signals. In this manner, the bus lines are configured per module, thereby allowing the test of each module according to its unique functionality.

The 1C test is conducted utilizing the chip's I/O ports 407 and 408. In the functional mode, the I/O port is utilized to deliver functional signals on 410 and 420. During the test, the signals are routed through the bus test switch 409 into the test bus 400. In this way, the path of the functional signals is affected only by the negligible input capacitance of the test switch 409 and 425.

Suppose that module B 102 is to be tested. In such a case, only the buffers on module B's input and output 402 and 412, respectively, are activated to enable the test patterns on 400 to reach module B input, and the module output to reach the 1C output port 408. The other buffers, buffers 401 and 411 of module A and buffers 403 and 413 of module C, are switched to their high impedance state. This provides complete isolation of the tested module within the testing environment. Additionally, the test patterns, and the resulting output patterns, are directly received by the tested module, and transmitted directly from the tested module with a minimum time delay, since no addition logic is required.

The verification test design according to the method of the invention significantly reduces the complexities involved in the test itself and substantially simplifies the IC design. Moreover, the IC's functional mode is changed by simply forcing the test input and output buffers to their high impedance state. As will be appreciated by those skilled in the art, in such a testing architecture, there are fewer test lines due to all of the tested modules sharing the same test bus lines.

The internal signals between the IC's modules are also transmitted through tri-state buffers. With reference to FIG. 4, the signals transmitted from module A 101 to module B 102 on 415 are buffered during the test mode by the tri-state buffer 405, to prevent interference on the input of module B 102. Similarly, signals transmitted from module B 102 to the input of module A 101 are buffered by the tri-state buffer 404, and the signals transmitted from module B 102 to the input of module C 103 are buffered by the tri-state buffer 406. It is important to understand that in the architecture disclosed by the present invention, the tri-state switches are located in the near vicinity of the functional ports of each of, the modules under testing, and in this way, the load on the functional signals is substantially minimized.

The tri-state buffers 405, 404, and 406 which deliver signals between the modules 101, 102 and 103, are designed to have controlled Bus Holders 421, 422, and 423 for minimizing DC leakage during test mode, caused by the floating nodes. The Bus Holders are required on the functional signals that are caused by a Tri-state buffer and used to maintain a non floating voltage level, the lines of the bus they are attached to. The Bus Holders float (i.e., are disabled) during the functional mode and in this way, they do not add any delay to the path of the functional signals.

FIG. 5 schematically illustrates the bus holder structure according to one embodiment of the invention. As was explained earlier, the bus holder 500 is utilized to maintain a fixed signal on the bus 506. The bus holder 500 consists of two inverters 501 and 502. The second inverter 502 is controlled by the control input 505, which is utilized to change the state of the inverter into its high impedance state while the chip is in its functional mode. In the test mode, the bus holder 500 is activated. Whenever the buffering device 507 enters its high impedance state, the state of the bus 506 maintains a non-floating value.

It is important to understand that this test mode design allows the designer to configure the SOC into the test modes of the individual integrated modules, and in this way, to verify and test the modules in their specific environment(s) (i.e., the environment in which they were designed). This is an advantage, which enables efficient use of the original testing tools that were designed for each module, without modification. It should be clear that the method of the present invention is applicable in ICs in general, and that the SOC implementation, that was elaborately described herein., is brought only to exemplify the testing method according to the invention Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A system for verification testing of modules within an integrated circuit comprising:
   one or more modules each having input/output contacts coupled to input/output contacts of each other module by a common test bus;
   a set of first externally controlled buffers selectively coupling the common test bus to input/output ports for the integrated circuit; and
   one or more sets of second externally controlled buffers each selectively coupling input/output contacts of a corresponding module to the common test bus; wherein
   each of the first and second externally controlled buffers is a tri-state buffer.

2. The system according to claim 1, further comprising:
   externally controlled bus holders each connecting an output of an externally controlled buffer of the one or more sets of second externally controlled buffers selectively coupling input contacts of a corresponding module to the common test bus with an input contact of another module, wherein the bus holders preserve a logic state appearing on the input contacts of the corresponding module prior to isolation of the input contacts of the corresponding module by the respective externally controlled buffer of the one or more sets of second externally controlled buffers.

3. The system according to claim 2, wherein the externally controlled bus holders each comprise a pair of serially connected inverters including at least one externally controlled tri-state inverter.

4. The system according to claim 1, wherein, during verification testing of the modules within the integrated circuit, input/output contacts for each module other than a selected module are isolated from the common test bus by associated externally controlled buffers of the one or more sets of second externally controlled buffers.

5. The system according to claim 1, wherein, during operation of the integrated circuit in a functional mode, input/output ports for the integrated circuit are isolated from the common test bus by associated externally controlled buffers of the set of first externally controlled buffers.

6. The system according to claim 5, further comprising:
   one or more functional buses separate from the common test bus and coupling the input/output ports of the integrated circuit to the one or more modules.

7. A system for verification testing of modules within an integrated circuit comprising:
   a common test bus coupling input/output contacts of all modules;
   externally controlled test-mode buffers selectively connecting the common test bus to input/output ports for the integrated circuit; and
   a plurality of sets of externally controlled module-select buffers each associated with a different module and selectively coupling input/output contacts of the associated module to the common test bus; wherein
   each of the externally controlled test-mode and module-select buffers is a tri-state buffer.

8. The system according to claim 7, further comprising:
   externally controlled bus holders each connecting at least one output of an externally controlled module-select buffer with an input contact of another module, wherein the at least one output selectively connects an input contact for an associated module to the common test bus, and wherein the bus holders preserve a logic state appearing on the input contacts of the corresponding module prior to isolation of the input contacts of the corresponding module by a respective externally controlled module-select buffer.

9. The system according to claim 8, wherein the externally controlled bus holders each comprise a pair of serially connected inverters including at least one externally controlled tri-state inverter.

10. The system according to claim 7, wherein, during verification testing of the modules within the integrated circuit, input/output contacts for each module other than a selected module are isolated from the common test bus by associated externally controlled module-select buffers.

11. The system according to claim 7, wherein, during operation of the integrated circuit in a functional mode, input/output ports for the integrated circuit are isolated from the common test bus by associated externally controlled test-mode buffers.

12. The system according to claim 11, further comprising:
   one or more functional buses separate from the common test bus and coupling the input/output ports of the integrated circuit to the one or more modules.

13. A method for verification testing of modules within an integrated circuit comprising:
   coupling input/output contact for one or more modules by a common test bus;
   selectively coupling the common test bus to input/output ports for the integrated circuit through a first set of tri-stateable buffers; and selectively coupling input/output contacts of each corresponding module to the common test bus through a second set of tri-stateable buffers.

14. The method according to claim 13, further comprising:

preserving a logic state appearing on input contacts of a selected module prior to isolation of the input contacts of the selected module; and transmitting the preserved logic state to input contacts of another module.

15. The method according to claim 14, further comprising:

employing externally controlled bus holders each comprising a pair of serially connected inverters including at least one externally controlled tri-state inverter.

16. The method according to claim 13, further comprising:

during verification testing of the modules within the integrated circuit, isolating input/output contacts for each module other than a selected module from the common test bus by associated externally controlled buffers of the second set of tri-stateable buffers.

17. The method according to claim 13, further comprising:

during operation of the integrated circuit in a functional mode, isolating input/output ports for the integrated circuit from the common test bus by associated externally controlled buffers of the first set of tri-stateable buffers and employing one or more functional buses separate from the common test bus to couple the input/output ports of the integrated circuit to the one or more modules.

18. An integrated circuit system comprising:

a first module comprising a first input, a first output and a second output;

a second module comprising a first input, and a first output;

a first buffer comprising a first output coupled to the first input of the first module, and a first input coupled to a test bus;

a second buffer comprising a first output, coupled to the first input of the first buffer, and a first input, coupled to a first input port of the integrated circuit and to a first functional bus;

a third buffer comprising a first input coupled to the first output of the first module, and a first output coupled to the test bus;

a fourth buffer comprising a first input, coupled to the first output of the third buffer, and a first output, coupled to a first output port of the integrated circuit and to a second functional bus.

19. The system of claim 18, wherein the first buffer, second buffer, third buffer and fourth buffer are tri-state buffers.

20. The system of claim 18, further comprising:

fifth buffer comprising a first input coupled to the second output of the first module, and a first output coupled to the first input of the second module.

21. The system of claim 18, further comprising:

a logic state holder coupled to the first input of the first module.

22. The system of claim 18, further comprising:

a fifth buffer comprising a first output coupled to the first input of the second module, and a first input coupled to the first input of the first buffer; and a sixth buffer comprising a first input coupled to the first output of the second module, and a first output coupled to the first output of the third buffer.

* * * * *